United States Patent
Motoshiromizu et al.

(10) Patent No.: US 7,112,966 B2
(45) Date of Patent: Sep. 26, 2006

(54) MAGNETIC RESONANCE IMAGING APPARATUS

(75) Inventors: Hirofumi Motoshiromizu, Chiyoda-ku (JP); Kunihito Suzuki, Hitachi (JP); Hiroyuki Watanabe, Chiyoda-ku (JP)

(73) Assignee: Hitachi, Ltd., Tokyo (JP)

( * ) Notice: Subject to any disclaimer, the term of this patent is extended or adjusted under 35 U.S.C. 154(b) by 14 days.

(21) Appl. No.: 10/966,941

(22) Filed: Oct. 15, 2004

(65) Prior Publication Data

US 2005/0099181 A1    May 12, 2005

(30) Foreign Application Priority Data

Nov. 6, 2003    (JP) .............................. 2003-376367

(51) Int. Cl.
   *G01V 3/00*    (2006.01)
(52) U.S. Cl. ...................................... 324/319; 324/318
(58) Field of Classification Search ................ 324/319, 324/318, 322, 307, 309, 300; 335/216, 296
   See application file for complete search history.

(56) References Cited

U.S. PATENT DOCUMENTS

| | | | |
|---|---|---|---|
| 5,194,810 A * | 3/1993 | Breneman et al. | 324/319 |
| 5,442,928 A | 8/1995 | Laskaris et al. | 324/318 |
| 6,172,588 B1 | 1/2001 | Laskaris et al. | 324/318 |
| 6,437,672 B1 * | 8/2002 | Takeshima et al. | 335/216 |
| 6,664,876 B1 | 12/2003 | Watanabe et al. | 324/319 |
| 6,667,676 B1 | 12/2003 | Watanabe et al. | 324/319 |

FOREIGN PATENT DOCUMENTS

| JP | 2002-159466 | 6/2002 |
|---|---|---|
| WO | WO 01/74243 A1 | 10/2001 |

OTHER PUBLICATIONS

U.S. Appl. No. 10/785,947, Superconductive Magnet Apparatus and Magnetic Resonance Imaging Apparatus.
U.S. Appl. No. 10/316,827, A Magnet for Magnetic Resonance Imaging Apparatus.

* cited by examiner

*Primary Examiner*—Brij B. Shrivastav
(74) *Attorney, Agent, or Firm*—Crowell & Moring LLP

(57) ABSTRACT

The MRI apparatus has ring-shaped superconducting coils arranged to vertically oppose each other. The superconducting coils are installed in ring-shaped cooling containers. The cooling containers are accommodated in radiation shield plates. The radiation shield plates are accommodated in vacuum vessels. The cooling containers are connected together at at least two locations. Support members are arranged between an outer wall surface of the lower cooling container and an inner wall surface of the lower vacuum vessel to support the lower cooling container on the lower vacuum vessel. The upper cooling container is free, supported only by the connecting tubes connecting the upper and lower cooling containers.

5 Claims, 4 Drawing Sheets

MAGNETIC RESONANCE IMAGING APPARATUS

CROSS-REFERENCE

The present application claims priority from Japanese application JP2003-376367 filed on Nov. 6, 2003, the content of which is hereby incorporated by reference into this application

BACKGROUND OF THE INVENTION

The present invention relates to a magnetic resonance imaging apparatus (also referred to as an MRI apparatus).

An example of a conventional magnetic resonance imaging apparatus is disclosed in JP-A-2002-159466. In the MRI apparatus disclosed in this official gazette, to minimize magnetic field variations caused by external vibrations, a cooling container accommodating a superconducting coil is incorporated in a pair of upper and lower vacuum vessels and supported on an inner wall of each vacuum vessel through three stays. The superconducting coils are connected together by two first connecting tubes.

In the magnetic resonance imaging apparatus described in JP-A-2002-159466, since the vacuum vessels are supported in a cantilever fashion on a floor, the upper vacuum vessel is oscillated longitudinally and laterally because mainly of a bent structure of a second connecting tube connecting the vacuum vessels. As the vacuum vessel vibrates, the cooling container accommodated in the vacuum vessel also vibrates. Because the lower cooling container is restrained from movement by the floor surface, an amplitude of oscillation of the lower cooling container is smaller than that of the upper cooling container. As a result, the superconducting coils installed in the upper and lower cooling containers are displaced relative to each other. When the upper and lower superconducting coils move relative to each other, a magnetic resonance image deteriorates. Particularly when a static magnetic field strength and an gradient magnetic field strength of an gradient magnetic field coil are increased to enhance an image quality, the oscillations of the gradient magnetic field coil used to intensify the magnetic fields significantly affect the magnetic resonance image.

BRIEF SUMMARY OF THE INVENTION

The present invention has been accomplished with a view to overcoming the aforementioned drawbacks experienced with conventional apparatus. It is an object of this invention to provide a magnetic resonance imaging apparatus that can prevent degradations of an magnetic resonance image.

To achieve the above objective, the present invention in one aspect provides a magnetic resonance imaging apparatus comprising: ring-shaped superconducting coils arranged to vertically oppose each other; a cooling container accommodating the superconducting coils; and a vacuum vessel accommodating the cooling container; wherein the cooling container has upper and lower cylindrical portions and a connecting tube connecting the cylindrical portions, the vacuum vessel is formed to enclose the cooling container, a plurality of support members are provided to support the lower cylindrical portion of the cooling container on a bottom inner surface of the vacuum vessel, and the upper cylindrical portion of the cooling container is kept in a free state.

In this aspect, a radiation shield plate may be arranged between the cooling container and the vacuum vessel to enclose the cooling container, and the plurality of support members may pass through the radiation shield plate. Or the plurality of support members may have first support members to support the cooling container on the radiation shield plate and second support members to support the radiation shield plate on the vacuum vessel. The connecting tube of the cooling container may be formed at two positions on the cylindrical portions almost symmetric in a circumferential direction. The support members are preferably attached at one end with fittings.

Another aspect to achieve the above objective provides a magnetic resonance imaging apparatus comprising: ring-shaped superconducting coils arranged to vertically oppose each other; ring-shaped cooling containers accommodating the superconducting coils respectively; radiation shield plates accommodating the cooling containers respectively; vacuum vessels accommodating the radiation shield plates respectively; a cooling container connecting tube connecting the upper and lower cooling containers; a radiation shield plate connecting tube accommodating the cooling container connecting tube; a vacuum vessel connecting tube connecting the upper and lower vacuum vessels and accommodating the radiation shield plate connecting tube; and support members to support the cooling containers on the vacuum vessels; wherein the support members are arranged between an outer wall surface of the lower cooling container and an inner wall surface of the lower vacuum vessel to support the lower cooling container on the lower vacuum vessel.

In this aspect, the support members may join at their intermediate portion to the radiation shield plate to support the radiation shield plate. The support members may have one support member arranged between an outer wall surface of the radiation shield plate and an inner wall surface of the vacuum vessel and the other support member arranged between an outer wall surface of the cooling container and an inner wall surface of the radiation shield plate, the "one" support member may support the lower radiation shield plate on the lower vacuum vessel, and the other support member may support the cooling container on the radiation shield plate. Or the support members may have a first support member to directly support the cooling container on the vacuum vessel, a second support member to support the cooling container on the radiation shield plate, and a third support member to support the radiation shield plate on the vacuum vessel. The first support member may be vertical support member and the second and third support members horizontal support members.

Other objects, features and advantages of the invention will become apparent from the following description of the embodiments of the invention taken in conjunction with the accompanying drawings.

DETAILED DESCRIPTION OF THE INVENTION

An MRI apparatus radiates an electromagnetic wave against a patient's body placed in an uniform static magnetic field, measures a nuclear magnetic resonance signal emitted from the body and performs image processing on the nuclear magnetic resonance signal obtained to produce a magnetic resonance image representing a physical property of the patient's body. To give position information to the nuclear magnetic resonance signal, an gradient magnetic field is applied to overlap the static magnetic field.

There are two types of MRI apparatus, one that generates a static magnetic field in a horizontal direction and one that generates a static magnetic field in a vertical direction. To generate a static magnetic field in the horizontal direction, a cylindrical type static magnetic field source is used; and to generate a static magnetic field in the vertical direction, an facing type static magnetic field source is used. To enhance an image quality requires increasing the static magnetic field strength. The MRI apparatus that produces a horizontal static magnetic field is superior to the one that produces a vertical static magnetic field in terms of increasing the intensity of the static magnetic field. However, the MRI apparatus that produces a horizontal static magnetic field lacks an openness for a patient.

The MRI apparatus that produces a vertical static magnetic field provides a sense of openness to the patient but can hardly control the generation of the static magnetic field or minimize a leakage flux. This MRI apparatus has a field intensity of 0.2T–0.7T and uses a permanent magnet, a normal conducting magnet and a superconducting magnet as the static magnetic field source. The MRI apparatus that generates a vertical static magnetic field and which excels in the openness for the patient is required to enhance the field strength to produce a high quality image. The image quality depends greatly on the external oscillation. This invention makes provision to prevent the vacuum vessels from being vibrated by external excitations, such as oscillations of the gradient magnetic field coil or of the floor surface on which the apparatus is installed and also to prevent these oscillations from being transmitted to the superconducting coils. This is explained in detail in the following example.

Figure 1:
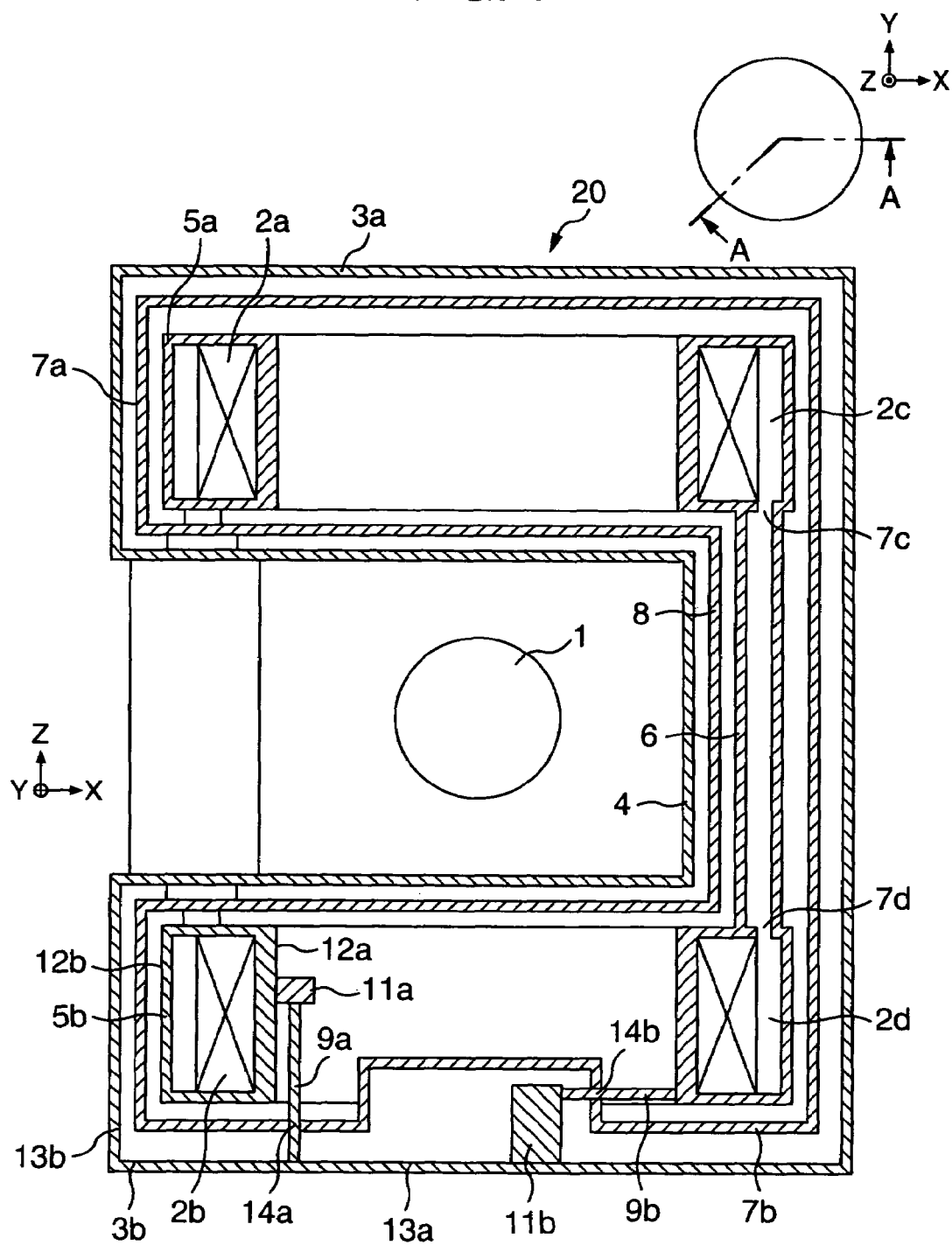
FIG. 1 is a vertical cross-sectional view showing an MRI apparatus as one embodiment of this invention.
Figure 2:
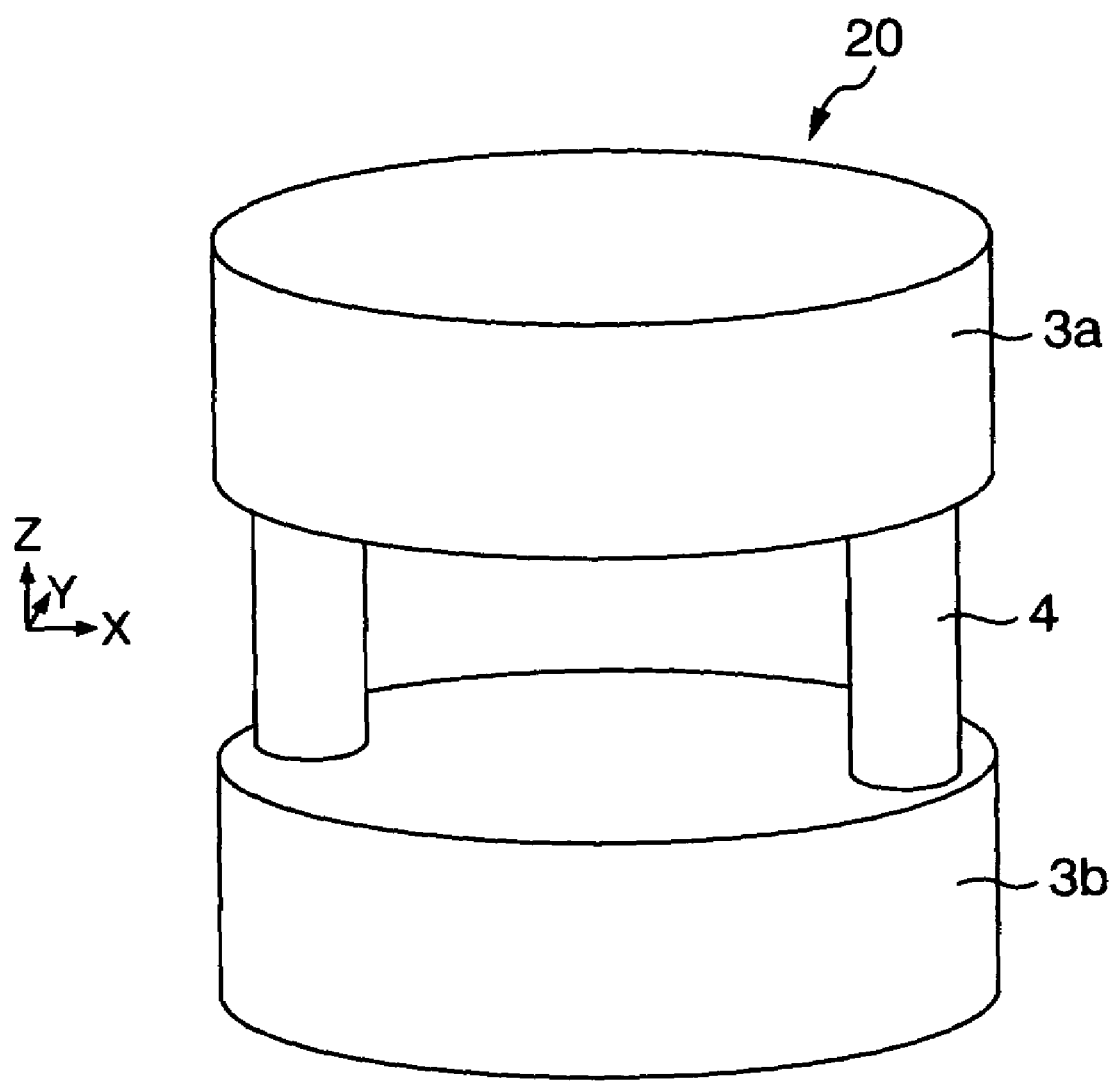
FIG. 2 is a perspective view of the MRI apparatus shown in FIG. 1.
Figure 3A:
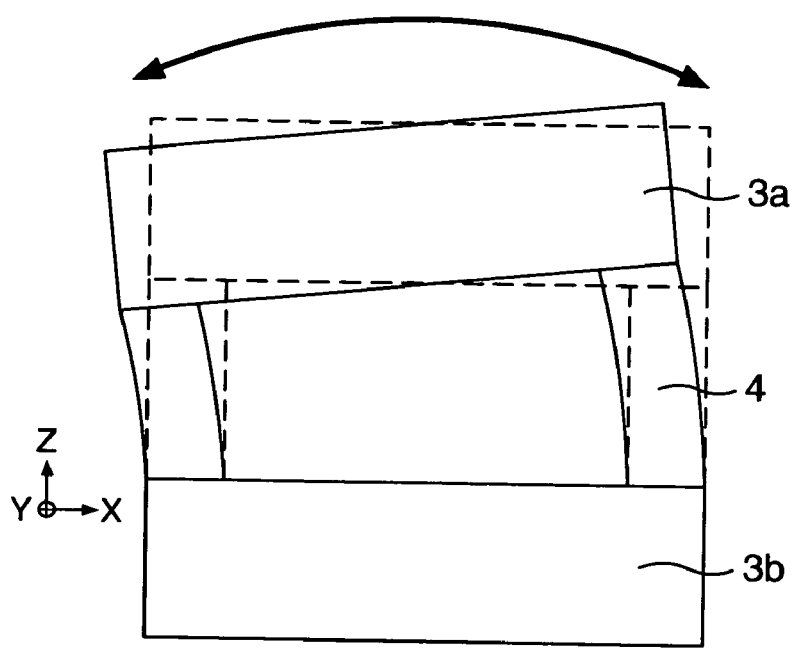
FIGS. 3A and 3B are schematic diagrams showing how the vacuum vessel used in the MRI oscillates.
Figure 3B:
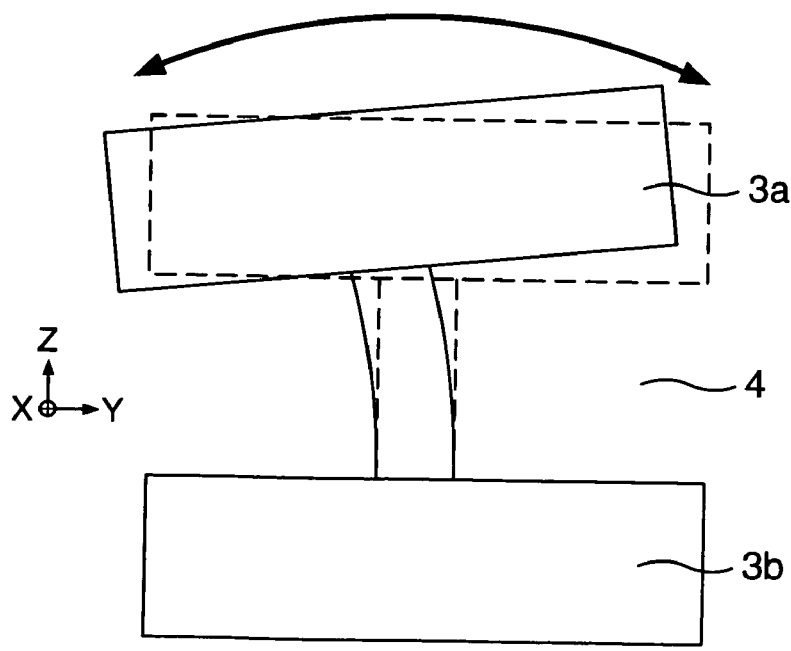

One embodiment of the MRI apparatus according to this invention is explained by referring to FIG. 1 to FIGS. 3A and 3B. FIG. 1 is a vertical cross-sectional view of the MRI apparatus; FIG. 2 is a perspective view of the same; and FIGS. 3A and 3B illustrate how the apparatus oscillates. The MRI apparatus 20 has a pair of vertically opposing superconducting coils 2a, 2b as a static magnetic field source with an imaging space 1 in between, a pair of vertically arranged vacuum vessels 3a, 3b each incorporating the superconducting coil 2a, 2b, and vacuum vessel connecting tubes 4, 4 connecting the vacuum vessels 3a, 3b together. Although in this embodiment the vertically arranged vacuum vessels 3a, 3b are connected together by the two vacuum vessel connecting tubes 4, 4, it is possible to use one or three or more vacuum vessel connecting tubes 4, provided that this arrangement produces an enough supporting force without impairing the openness.

A center of the imaging space 1 where a patient not shown is placed is taken as an origin. In this imaging space 1, a vertical direction is taken to be a Z axis, a lateral direction in which the two vacuum vessel connecting tubes 4, 4 are arranged is taken to be an X axis, and a longitudinal direction crossing the X axis at right angles is taken to be a Y axis. At an upper right corner in FIG. 1a schematic top view of the MRI apparatus 20 is shown. A cross section taken along the line A—A in the top view is shown at the center of FIG. 1.

The superconducting coils 2a, 2b are wound like a ring to produce a uniform, vertical, static magnetic field in the imaging space 1. The superconducting coils 2a, 2b are accommodated in ring-shaped cooling containers 5a, 5b in which they are immersed in a medium such as a liquid helium to be cooled down to and held at a temperature where they exhibit a superconducting characteristic. The cooling container 5a is accommodated in the vacuum vessel 3a and the cooling container 5b in the vacuum vessel 3b.

Between the cooling container 5a and the vacuum vessel 3a and between the cooling container 5b and the vacuum vessel 3b there are installed radiation shield plates 7a, 7b to block radiating heat from entering the cooling containers 5a, 5b. The radiation shield plates 7a, 7b are formed to enclose the cooling containers 5a, 5b. The coolant in the cooling containers 5a, 5b and the radiation shield plates 7a, 7b are cooled by a refrigerating machine not shown.

The cooling containers 5a, 5b vertically arranged with the imaging space 1 interposed therebetween are supported a predetermined distance apart from each other in a vertical direction by a cooling container connecting tube 6 arranged near an outer circumference of the cooling containers 5a, 5b. The cooling container connecting tube 6 is formed with holes 7c, 7d that communicate with accommodation spaces 2c, 2d in the upper and lower cooling containers 5a, 5b in which the superconducting coils 2a, 2b are installed. This arrangement ensures that the cooling container connecting tube 6 is thermally connected to the upper and lower cooling containers 5a, 5b.

Around an outer peripheral portion of the cooling container connecting tube 6 is provided a radiation shield plate connecting tube 8 that connects the radiation shield plates 7a, 7b together. The radiation shield plate connecting tube 8 supports the radiation shield plates 7a, 7b a predetermined distance apart from each other in a vertical direction. The cooling containers 5a, 5b and the cooling container connecting tube 6 are completely enclosed by the radiation shield plates 7a, 7b and the radiation shield plate connecting tube 8 to prevent heat from entering the cooling containers 5a, 5b from outside.

Increasing the vertical distance between the vacuum vessels 3a, 3b and moving the vacuum vessel connecting tubes 4 away from the imaging space 1 can widen the space for the patient, enhancing the level of openness. Members forming the superconducting magnet device, including the vacuum vessels 3a, 3b, radiation shield plates 7a, 7b, cooling containers 5a, 5b, vacuum vessel connecting tubes 4 and radiation shield plate connecting tubes 8, are made of non-magnetic metal materials, such as stainless steel and aluminum alloy.

The MRI apparatus 20 of this embodiment has gradient magnetic field coils and radio frequency coils, both not shown. The gradient magnetic field coils apply a gradient magnetic field by superimposing it on the static magnetic field. Arranged on both sides of the imaging space 1, the gradient magnetic field coils provide position information of nuclear magnetic resonance signals. The radio frequency coils produce electromagnetic waves. The superconducting magnet device is provided with a table on which a patient lies and is guided through the imaging space 1, a power supply device to supply power to the superconducting magnet device, the gradient magnetic field coils and the radio frequency coils, a control device to control the whole MRI apparatus, and an image reconstruction device to reconstruct nuclear magnetic resonance signals from the patient into a nuclear magnetic resonance image.

The cooling containers 5a, 5b and the radiation shield plates 7a, 7b are supported by a plurality of support members 9a, 9b which are secured to the vacuum vessels 3a, 3b. The support members 9a, 9b are shaped like bars, single cylinders, or multiple cylinders. For thermal insulation of the cooling containers 5a, 5b and the radiation shield plates 7a, 7b from the vacuum vessels 3a, 3b, the support members 9a, 9b are made of a nonmagnetic material with a small heat conductivity, e.g., fiber-reinforced synthetic resin material such as glass fiber-reinforced epoxy resin. Bar or single cylinder is less expensive than the multiple cylinder if they have the same heat insulating performance. It should be noted, however, that bar and single cylinder shapes require a greater connection distance. In this embodiment, bar-shaped support members 9a, 9b are used.

As described above, the cooling containers 5a, 5b are supported on the vacuum vessels 3a, 3b by the vertical support members 9a and the horizontal support members 9b. The vertical support members 9a and the horizontal support members 9b hold an inner circumferential surface 12 of the lower cooling container 5b through fittings 11a, 11b to an inner wall bottom surface 13a of the lower vacuum vessel 3b. The vertical support members 9a and the horizontal support members 9b are arranged at intervals in a circumferential direction. It is preferred that the support members be arranged symmetrical about the Z axis and also symmetrical with respect to XZ and YZ planes.

While in this embodiment the horizontal support members 9b and the vertical support members 9a are used, a plurality of diagonal support members may be used to produce the similar effect. In this embodiment, four of the horizontal support members 9b are arranged at a 90-degree pitch about the Z axis from the XZ plane and the vertical support members 9a are placed 45 degrees apart about the Z axis from the horizontal support members 9b.

The radiation shield plates 7a, 7b are kept in a temperature range between the room temperature which is a temperature of the outer circumference of the vacuum vessels 3a, 3b and the superconducting temperature to which the cooling containers 5a, 5b is cooled by a coolant. Hence, a large temperature gradient is produced in the support members 9a, 9b. The radiation shield plates 7a, 7b are preferably kept at 60–70K. To keep the radiation shield plates 7a, 7b at this temperature, the support members 9a, 9b are mounted at positions 14a, 14b apart from the vacuum vessel 3b and the cooling container 5b, considering a heat ingression from the support members 9a, 9b, a heat capacity of the radiation shield plates 7a, 7b and a cooling capacity of the refrigerator not shown. Thus, the cooling container 5b and the radiation shield plate 7b are supported on the bottom surface 13a of the lower vacuum vessel 3b through the support members 9a, 9b.

The vertically arranged superconducting coils 2a, 2b generate electromagnetic forces attracting or repulsing each other. Since the cooling containers 5a, 5b holding the superconducting coils 2a, 2b are mechanically supported by the cooling container connecting tube 6, the forces generated by the upper and lower superconducting coils 2a, 2b cancel each other. The vertical support member 9a is required to have a strength to withstand the weight of the superconducting coil 2a, 2b and the cooling container 5a, 5b as well as their associated components, thermal contraction during cooling, and impacts during transport.

The horizontal support member 9b is not loaded by the weight of the superconducting coil 2a, 2b and the cooling container 5a, 5b as well as their associated components. But it must be strong enough to prevent the cooling container 5b from deviating from the center and withstand impacts experienced during transport.

The number and the cross-sectional area of the support members 9a, 9b are preferably large in terms of strength but, from the standpoint of minimizing heat ingress into the cooling container 5b, they are preferably small. From the standpoint of strength, the length of the support members 9a, 9b is preferably short. But it is preferably longer in terms of preventing heat ingress into the cooling container 5b.

Next, the operation of the MRI apparatus 20 of this embodiment will be explained as follows. The vacuum vessels 3a, 3b are oscillated by external excitations, such as oscillations of the gradient magnetic field coils (not shown) and of the floor on which the apparatus is installed. The oscillation of the apparatus is shown exaggerated in FIGS. 3A and 3B. In this MRI apparatus 20, since vibrations of the lower vacuum vessel 3b are restrained by the floor, they are smaller in magnitude than those of the upper vacuum vessel 3a. On the bottom surface of the vacuum vessel 3b there are almost no vibrations and it can be considered that the vibrations are restrained by the weight of the MRI apparatus 20. That is, the bottom surface of the vacuum vessel 3b theoretically constitutes a node of vibrations.

In this embodiment, the lower vacuum vessel 3b with smaller vibrations supports the cooling container 5b and therefore the vibrations transmitted from the vacuum vessel 3b through the support members 9a, 9b to the cooling container 5b are small. Thus, the vibrations that may be generated by the superconducting coil 2b installed in the cooling container 5b does not result in magnetic field variations. Since there is no magnetic field variations, the MRI apparatus 20 can create a clear nuclear magnetic resonance image. Since the cooling container 5b is supported on the bottom surface of the lower vacuum vessel 3b which constitutes a node of vibrations, a significant vibration minimizing effect is produced.

In this embodiment, although the lower cooling container 5b is supported by connecting the inner circumferential surface of the lower cooling container 5b to the bottom surface of the lower vacuum vessel 3b, the supporting surface is not limited to this example. For example, an outer circumferential surface 12b of the lower cooling container 5b may be supported on the bottom surface of the lower vacuum vessel 3b through the vertical support member. This arrangement makes a fall moment of the cooling container greater than when the cooling container 5b is supported at its inner circumferential surface. This in turn increases the stability of the MRI apparatus. It is also possible to support the cooling container on a side surface 13b of the lower vacuum vessel 3b.

When the cooling container is supported on the side surface of the vacuum vessel 3b, it is preferred that the support position be set close to the bottom surface of the vacuum vessel 3b because the bottom surface of the vacuum vessel 3b theoretically constitutes a node of vibrations and the vibrations of the side surface 13b progressively increase away from the bottom surface. That is, as the support members 9a, 9b move away from the bottom surface, the vibrations transmitted to the cooling container 5b through the support members 9a, 9b increase. To suppress the vibrations of the side surface 13b, the stiffness of the side surface 13b needs to be increased. Increasing the thickness of the side surface 13b of the cooling container 5b results in an increased stiffness of the side surface 13b and therefore reduced vibrations of the side surface 13b.

Figure 4:
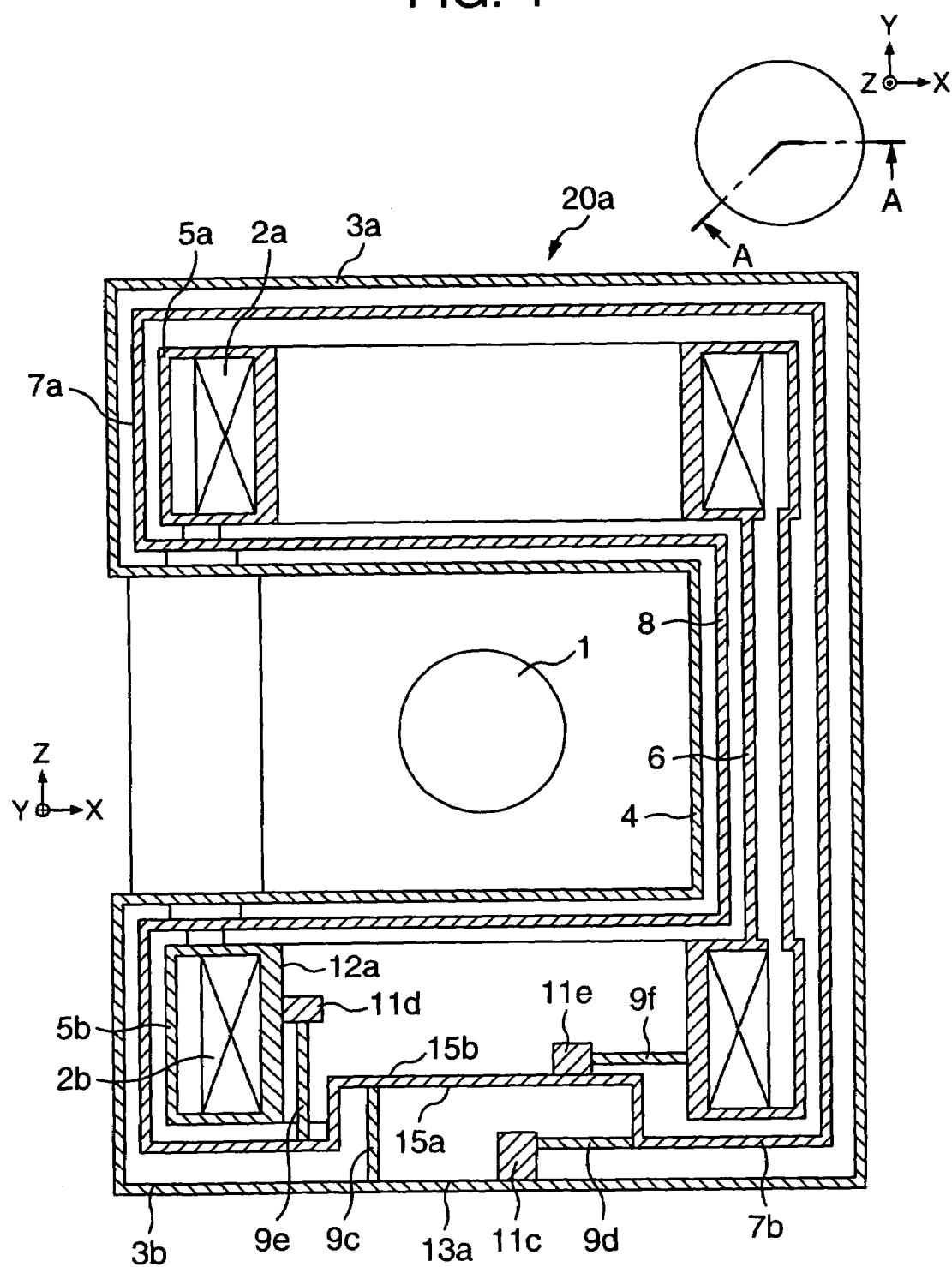
FIG. 4 is a vertical cross-sectional view showing an MRI apparatus as another embodiment of this invention.

A vertical cross-sectional view of another embodiment of the MRI apparatus according to this invention is shown in FIG. 4. In the embodiment shown in FIG. 1, the lower cooling container 5b is supported on the lower vacuum vessel 3b through the support members 9a, 9b. In this embodiment the radiation shield plate 7b is supported on the lower vacuum vessel 3b through a first support member and the lower cooling container 5b is supported on the radiation shield plate 7b through a second support member.

An outer wall surface 15a of the radiation shield plate 7b is supported on the inner wall surface 13a of the vacuum vessel 3b through a first vertical support member 9c and a first horizontal support member 9d. The first horizontal support member 9d has its end portion on the vacuum vessel 3b side connected with a fitting 11c.

The inner circumferential surface of the cooling container 5b is supported on an inner wall surface 15b of the radiation shield plate 7b through a second vertical support member 9e and a second horizontal support member 9f. The second vertical support member 9e has its end portion on the cooling container 5b side connected with a fitting 11d and the second horizontal support member 9f has its end portion on the radiation shield plate 7b side connected with a fitting 11e. The cooling container 5b is supported on the inner wall surface 15b of the radiation shield plate 7b through the fittings 11d, 11e, the second vertical support member 9e and the second horizontal support member 9f.

The second vertical support member 9e and the second horizontal support member 9f may be provided not just between the lower cooling container 5b and the radiation shield plate 7b but also between the upper cooling container 5a and the radiation shield plate 7a. In that case, the upper cooling container 5a and the radiation shield plate 7a are held together by the support member, so that the stiffness of the cooling container 5a and the radiation shield plate 7a increase. As a result, the vibrations transmitted through the support member to the cooling container 5a can be minimized.

In this embodiment since the lower cooling container 5b is supported on the lower vacuum vessel 3b through the first support members 9c, 9d, the radiation shield plate 7b and the second support members 9e, 9f, the vibrations of the vacuum vessel 3b transmitted to the cooling container 5b through the support members 9c–9f can be reduced. Further, the heat insulation distance provided by the support members can be increased, compared to a case where the vacuum vessel 3b and the cooling container 5b are directly supported only by the support members. Since the cooling container 5b and the radiation shield plate 7b are connected together through the second support members 9e, 9f, their stiffness is increased.

In the embodiment of FIG. 1, the cooling container 5b is supported on the vacuum vessel 3b by the support members 9a, 9b. In the embodiment of FIG. 4, on the other hand, the cooling container 5b is supported on the vacuum vessel 3b through the radiation shield plate 7b. These two arrangements may be combined to support the cooling container 5b on the vacuum vessel 3b by the support members in the vertical direction and through the radiation shield plate 7b in the horizontal direction.

That is, the vibrations of the cooling container can be reduced by directly or indirectly supporting the lower cooling container on the lower vacuum vessel. The MRI apparatus constructed as described above allows the support structure of the cooling containers and radiation shield plates to be designed with a high degree of freedom in terms of such design items as support space, insulated support performance and support member strength. In this case also, the transmission of vibrations from the vacuum vessel to the cooling container can be reduced.

In the above embodiments, the upper cooling container 5a and the radiation shield plate 7a are not connected to the upper vacuum vessel 3a. In the real MRI apparatus, the upper vacuum vessel 3a accommodates a refrigerating machine and liquid helium injection piping, with their associated components connected to the cooling container 5a and the radiation shield plate 7a. In this arrangement, the associated components of the refrigerating machine and others are insulated from vibrations of the vacuum vessel 3a by bellows, so that the vibration minimizing effect of the above embodiments is not impaired.

As described above, in the MRI apparatus that generates a static magnetic field in a vertical direction, this invention is characterized in that the cooling container is supported by the lower vacuum vessel whose vibrations are smaller than the upper vacuum vessel. This construction minimizes the transmission to the superconducting coils of the vibrations of the vacuum vessel which is externally excited by vibrations of the gradient magnetic field coil and of the floor on which the apparatus is installed. Further, this invention can prevent an MR image from being degraded by vibrations of the superconducting coils.

The preferred embodiments described herein are therefore illustrative and not restrictive, the scope of the invention being indicated by the appended claims, and all variations which come within the meaning of the claims are intended to be embraced therein.

The invention claimed is:

1. A magnetic resonance imaging apparatus comprising:
   ring-shaped superconducting coils arranged to vertically oppose each other;
   ring-shaped cooling containers accommodating the superconducting coils respectively;
   radiation shield plates accommodating the cooling containers respectively;
   vacuum vessels accommodating the radiation shield plates respectively;
   a cooling container connecting tube connecting the upper and lower cooling containers;
   a radiation shield plate connecting tube accommodating the cooling container connecting tube;
   a vacuum vessel connecting tube connecting the upper and lower vacuum vessels and accommodating the radiation shield plate connecting tube; and
   support members to support the cooling containers on the vacuum vessels;
   wherein the support members are arranged between an outer wall surface of the lower cooling container and an inner wall surface of the lower vacuum vessel to support the lower cooling container on the lower vacuum vessel.

2. A magnetic resonance imaging apparatus according to claim 1, wherein the support members join at their intermediate portion to the radiation shield plate to support the radiation shield plate.

3. A magnetic resonance imaging apparatus according to claim 1, wherein the support members have a first support member arranged between an outer wall surface of the radiation shield plate and an inner wall surface of the vacuum vessel and a second support member arranged between an outer wall surface of the cooling container and an inner wall surface of the radiation shield plate, the first support member supports the lower radiation shield plate on the lower vacuum vessel, and the second support member supports the cooling container on the radiation shield plate.

4. A magnetic resonance imaging apparatus according to claim 1, wherein the support members have a first support member to directly support the cooling container on the vacuum vessel, a second support member to support the cooling container on the radiation shield plate, and a third support member to support the radiation shield plate on the vacuum vessel.

5. A magnetic resonance imaging apparatus according to claim 4, wherein the first support member is vertical support member and the second and third support members are horizontal support members.

* * * * *